United States Patent
Sohmer et al.

(10) Patent No.: US 8,873,151 B2
(45) Date of Patent: Oct. 28, 2014

(54) ILLUMINATION SYSTEM FOR A MICROLITHGRAPHIC EXPOSURE APPARATUS

(75) Inventors: Alexander Sohmer, Aalen (DE); Aurelian Dodoc, Heidenheim (DE); Heiko Feldmann, Aalen (DE); Wilhelm Ulrich, Aalen (DE); Gerhard Fuerter, Ellwangen (DE); Rafael Egger, Munich (DE); Artur Moegele, Oberkochen (DE); Michael Raum, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1550 days.

(21) Appl. No.: 11/911,904

(22) PCT Filed: Apr. 26, 2006

(86) PCT No.: PCT/EP2006/003864
§ 371 (c)(1),
(2), (4) Date: Oct. 18, 2007

(87) PCT Pub. No.: WO2006/114294
PCT Pub. Date: Nov. 2, 2006

(65) Prior Publication Data
US 2008/0192359 A1 Aug. 14, 2008

Related U.S. Application Data

(60) Provisional application No. 60/674,691, filed on Apr. 26, 2005.

(51) Int. Cl.
*G02B 3/00* (2006.01)
*G03F 7/20* (2006.01)
*G02B 17/08* (2006.01)
*G02B 27/00* (2006.01)

(52) U.S. Cl.
CPC ........ *G03F 7/70075* (2013.01); *G02B 17/0892* (2013.01); *G02B 27/0043* (2013.01)
USPC ........................................................ 359/649

(58) Field of Classification Search
USPC ........................................ 359/649–661, 739
See application file for complete search history.

(56) References Cited

U.S. PATENT DOCUMENTS

| | | | |
|---|---|---|---|
| 6,285,443 B1 | 9/2001 | Wangler et al. |
| 6,366,410 B1 | 4/2002 | Schultz et al. |
| 6,583,937 B1 | 6/2003 | Wangler et al. |
| 6,680,803 B2 | 1/2004 | Schultz et al. |

(Continued)

FOREIGN PATENT DOCUMENTS

| | | |
|---|---|---|
| DE | 19653983 | 6/1998 |
| EP | 1 316 832 | 6/2003 |
| WO | WO 2006/084479 | 8/2006 |

*Primary Examiner* — Thomas K Pham
*Assistant Examiner* — Vipin Patel
(74) *Attorney, Agent, or Firm* — Fish & Richardson P.C.

(57) ABSTRACT

An illumination system of a microlithographic exposure apparatus comprises a condenser for transforming a pupil plane into a field plane. The condenser has a lens group that contains a plurality of consecutive lenses. These lenses are arranged such that a light bundle focused by the condenser on an on-axis field point converges within each lens of the lens group. At least one lens of the lens group has a concave surface. The illumination system may further comprise a field stop objective that at least partly corrects a residual pupil aberration of the condenser.

25 Claims, 8 Drawing Sheets

(56) References Cited

U.S. PATENT DOCUMENTS

| | | | |
|---|---|---|---|
| 7,064,806 B2 * | 6/2006 | Tsuji | 355/67 |
| 7,130,129 B2 * | 10/2006 | Schultz et al. | 359/649 |
| 7,551,361 B2 * | 6/2009 | Rostalski et al. | 359/649 |
| 2002/0171944 A1 | 11/2002 | Suenaga et al. | |
| 2003/0086183 A1 | 5/2003 | Wagner et al. | |
| 2004/0017885 A1 * | 1/2004 | Antoni et al. | 378/34 |
| 2004/0027549 A1 * | 2/2004 | Nagayama | 355/55 |
| 2004/0070742 A1 | 4/2004 | Suenaga et al. | |
| 2004/0125459 A1 * | 7/2004 | Tanitsu et al. | 359/619 |
| 2007/0165202 A1 * | 7/2007 | Koehler et al. | 355/67 |
| 2007/0216887 A1 * | 9/2007 | Singer et al. | 355/67 |

* cited by examiner

ILLUMINATION SYSTEM FOR A MICROLITHGRAPHIC EXPOSURE APPARATUS

CROSS-REFERENCE TO RELATED APPLICATIONS

This application is a National Phase application under 35 U.S.C.§371 filed from International Patent Application Serial No. PCT/EP2006/003864, filed on Apr. 26, 2006, which claims benefit under 35 U.S.C. 119 (e)(1) of U.S. provisional Application No. 60/674,691 filed Apr. 26, 2005.

BACKGROUND OF THE INVENTION

1. Field of the Invention

The invention relates generally to an illumination system for a microlithographic projection exposure apparatus. Such apparatuses are used in the manufacture of integrated circuits and other microstructured devices. More particularly, the invention relates to a condenser for such an illumination system that transforms a pupil plane into a field plane in which a field stop is arranged. The invention also relates to a field stop objective that images the field stop onto a mask plane.

2. Description of Related Art

Microlithography (also referred to as photolithography) is a technology for the fabrication of integrated circuits, liquid crystal displays and other microstructured devices. More particularly, the process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, the wafer with the photoresist on top is exposed to projection light through a mask in a projection exposure apparatus. The mask contains a circuit pattern to be projected onto the photoresist. After the exposure, the photoresist is developed to produce an image corresponding to the circuit pattern contained in the mask. Then an etch process transfers the circuit pattern into the thin film stacks on the wafer. Finally, the photoresist is removed.

A projection exposure apparatus typically includes an illumination system, a mask alignment stage, a projection objective and a wafer alignment stage. The illumination system illuminates a region of the mask that is to be projected onto the photoresist.

Usually the illumination system contains a pupil plane in which an optical raster element is positioned. The optical raster element influences the geometry of the region that is illuminated on the mask. The light intensity distribution in the pupil plane determines the angular distribution of the projection light impinging on the mask. For modifying the intensity distribution in the pupil plane, various optical elements, for example axicon elements or diffractive optical elements, may be used in the illumination system.

A condenser, which usually comprises a plurality of lenses, transforms the pupil plane into a field plane. This means that the condenser images an object positioned at infinity on the field plane. Often a field stop comprising a plurality of adjustable blades is positioned in the field plane. The field stop ensures sharp edges of the region that is illuminated on the mask. To this end, a field stop objective images the field stop onto the mask plane in which the mask is positioned.

The illumination system has to ensure a very uniform irradiance in the mask plane. The uniformity of the irradiance is often expressed in terms of the relative change of the irradiance over 1 mm in an arbitrary direction. This gradient of the irradiance in the mask plane should not exceed a certain value that may be as low as 0.1%/mm or even 0.015%/mm.

Furthermore, the illumination system should produce a chief ray distribution in its exit pupil that matches the chief ray distribution of the subsequent projection objective. Usually it is desired that the chief rays are collimated, i.e. the exit pupil is positioned at infinity. In this case the illumination system is referred to as being telecentric on the image side.

Another property of highly advanced illumination systems is a good pole balance. The pole balance denotes the ability of an illumination system to correctly transform an intensity distribution in the pupil plane into an angular distribution in the mask plane. For example, if only two poles are illuminated in the pupil plane with perfect symmetry, a perfect pole balance (PB=0) means that the irradiance at an arbitrary point in the mask plane results from equal contributions from both poles. If PB≠0 in the case of a dipole illumination, light rays impinging from one side on a field point are more intense than light rays impinging from the other side.

Another property, which has to be fulfilled by the condenser of the illumination system and which is closely related to the pole balance, is the extent to which the sine condition is fulfilled. According to the sine condition the distance from the optical axis in the pupil plane is proportional to the sine of the angle of incidence in the field plane. Ideally, the sine condition is perfectly fulfilled for all angles of incidence, and also for all field points.

These properties should be achieved with an illumination system having a short overall length, containing lenses with a small diameter and maintaining a certain minimum distance between the last lens and the mask plane.

Meeting these tight specifications has become more difficult in illumination systems that do not comprise a light homogenization rod. Such a rod, which is known, for example, from U.S. Pat. No. 6,285,443, is used to homogenize the illumination light bundle. Since the rod does not maintain the polarization state of the illumination light bundle, its use is restricted to illumination systems without polarization control.

From U.S. Pat. No. 6,583,937 B1 a condenser of a rod-less illumination system is known that comprises five lenses. The first surface of the condenser is aspherical.

US 2002/0171944 A1 discloses a condenser of a rod-less illumination system that comprises four lenses, namely a negative meniscus lens having an aspherical concave front surface, two bi-convex lenses and a flat convex lens having an aspherical convex rear surface.

U.S. Pat. No. 6,680,803 B2 discloses a field stop-objective for a rod-less illumination system comprising a totality of 9 lenses.

From DE 196 53 983 A1 another field stop objective is known comprising only 7 lenses with at least three aspherical surfaces. In one embodiment, this objective ensures a telecentricity error of less than 0.3 mrad.

SUMMARY OF THE INVENTION

It is a first object of the present invention to provide an improved condenser for an illumination system for a microlithographic exposure apparatus.

This object is achieved by a condenser comprising a lens group that contains a plurality of consecutive lenses. These lenses are arranged such that a light bundle focused by the condenser on an on-axis field point converges within each lens of the lens group. At least one lens of the lens group has a concave surface.

In the context of the present application the term "lens" shall denote a single refractive optical element that may have curved or planar surfaces.

The condenser according to the invention has a small telecentricity error, a good pole balance, only very small deviations from the sine condition, a small gradient of the irradiance and a large optical geometrical flux of more than 15 mm.

Generally a small telecentricity error of the condenser is advantageous if the field stop objective is telecentric at its object side, too. However, there may be cases in which this objective is significantly non-telecentric. The condenser may then be designed such that the directions of the chief rays in its exit pupil match as closely as possible the directions of the chief rays in the entrance pupil of the subsequent field stop objective. The deviations between these directions may be as small as 1 mrad.

It is a further object of the present invention to provide an improved illumination system for a microlithographic exposure apparatus comprising a condenser and a field stop objective.

This further object is achieved by an illumination system with a field stop objective that at least partly corrects a residual pupil aberration of the condenser.

When designing such an illumination system, it may be advantageous to optimize the design of the condenser and the field stop objective not separately for each component, but for the entire optical sub-system consisting of the condenser and the field stop objective. By suitably adjusting the optical properties of the condenser on the one hand and the field stop objective on the other hand, it is possible to allow deviations from certain optical properties in the field stop plane, in particular of the telecentricity error, from the optical properties required in the mask plane by a factor that may be as large as two or even four. Similar considerations apply to the spot diameter in the field stop plane and the mask plane. The spot is the illuminated region in a field plane if a preceding pupil plane is traversed by a parallel light bundle.

In some embodiments, the field stop objective has an image side numerical aperture $NA_i$, and a maximum image height $h_{max}$ with $NA_i \cdot h_{max} > 15$ mm.

In certain embodiments, the condenser has a first concave optical surface positioned immediately adjacent the field plane and having a radius of curvature $r_i$ and an axial distance $d_i$ from the field plane with $d_i < r_i < 2.5 \cdot d_i$ and the field stop objective has a second concave optical surface being positioned immediately adjacent the field plane and having a radius of curvature $r_2$ and an axial distance $d_2$ from the field plane with $d_2 < r_2 < 2.5 \cdot d_2$. The working distance of the field stop objective from the field plane can be between 10 mm and 90 mm. The radius of curvature $r_i$ can be greater than 80 mm. The radius of curvature $r_2$ can be greater than 80 mm.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
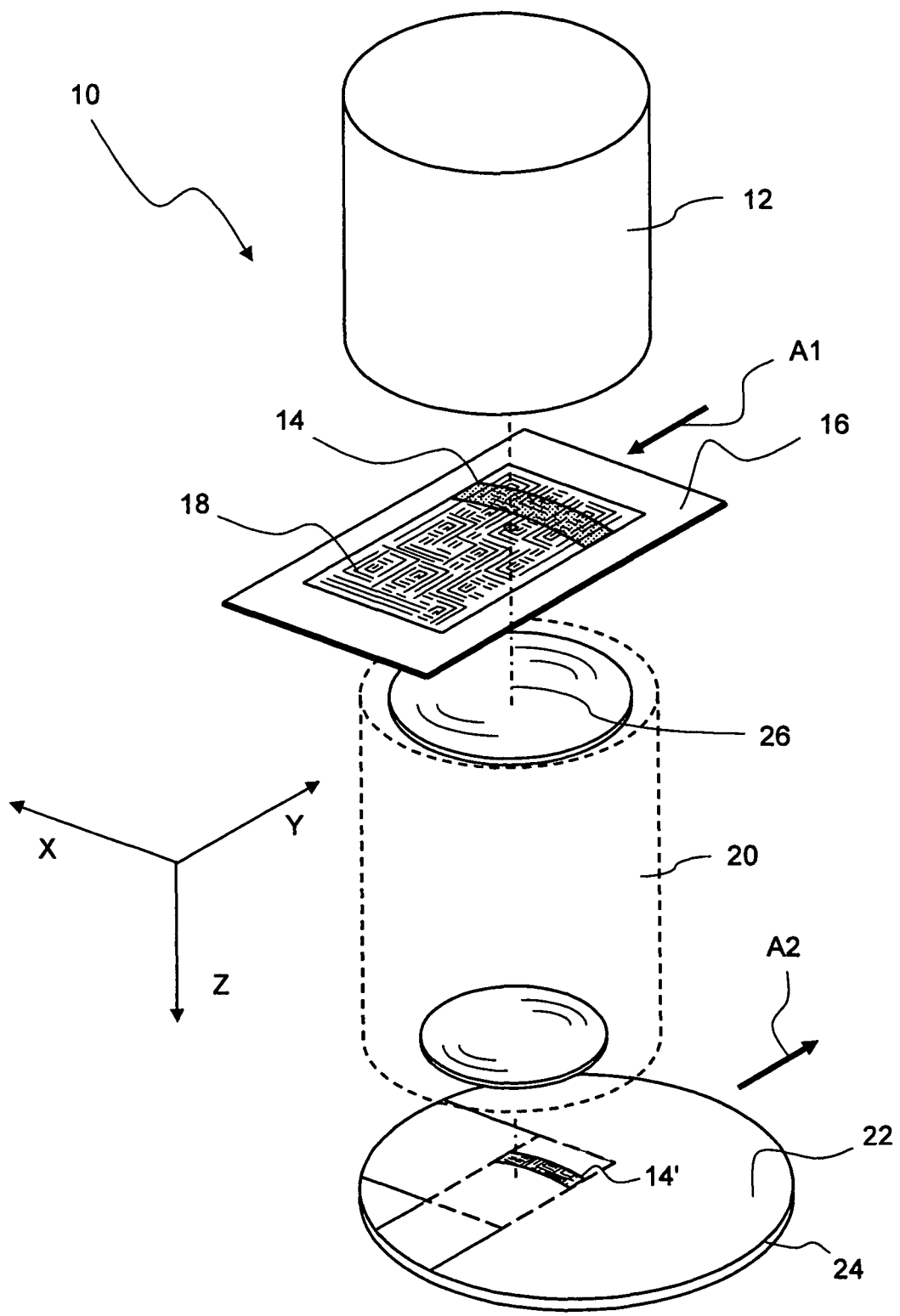
FIG. 1 is a perspective and simplified view of a projection exposure apparatus comprising an illumination system and a projection objective.

FIG. 1 shows a perspective and highly simplified view of a projection exposure apparatus 10 that comprises an illumination system 12 for producing a projection light bundle. The projection light bundle illuminates a field 14 on a mask 16 containing minute structures 18. In this embodiment, the illuminated field 14 has approximately the shape of a ring segment. However, other shapes of the illuminated field 14 are contemplated as well.

A projection objective 20 images the structures 18 within the illuminated field 14 onto a light sensitive layer 22, for example a photoresist, which is deposited on a substrate 24. The substrate 24, which is realized in this embodiment as a silicon wafer, is arranged on a wafer stage (not shown) such that a top surface of the light sensitive layer 22 is precisely located in an image plane of the projection objective 20. The mask 16 is positioned by means of a mask stage (not shown) in an object plane of the projection objective 20. Since the latter has a magnification of less than 1, a minified image 14' of the structures 18 within the illuminated field 14 is projected onto the light sensitive layer 22.

During the projection, the mask 16 and the substrate 24 move along a scan direction which coincides with the Y-direction. Thus the illuminated field 14 scans over the mask 16 so that structured areas larger than the illuminated field 14 can be continuously projected. Such a type of projection exposure apparatus is often referred to as "step-and-scan tool" or simply a "scanner". The ratio between the velocities of the mask 16 and the substrate 24 is equal to the magnification of the projection objective 20. If the projection objective 20 inverts the image, the mask 16 and the substrate 24 move in opposite directions, as this is indicated in FIG. 1 by arrows A1 and A2. However, the present invention may also be used in stepper tools in which the mask 16 and the substrate 24 do not move during projection.

In the embodiment shown, the illuminated field 14 is not centered with respect to an optical axis 26 of the projection objective 20. Such an off-axis illuminated field 14 may be necessary with certain types of projection objectives 20, for example objectives that contain one or more truncated mirrors.

Figure 2:
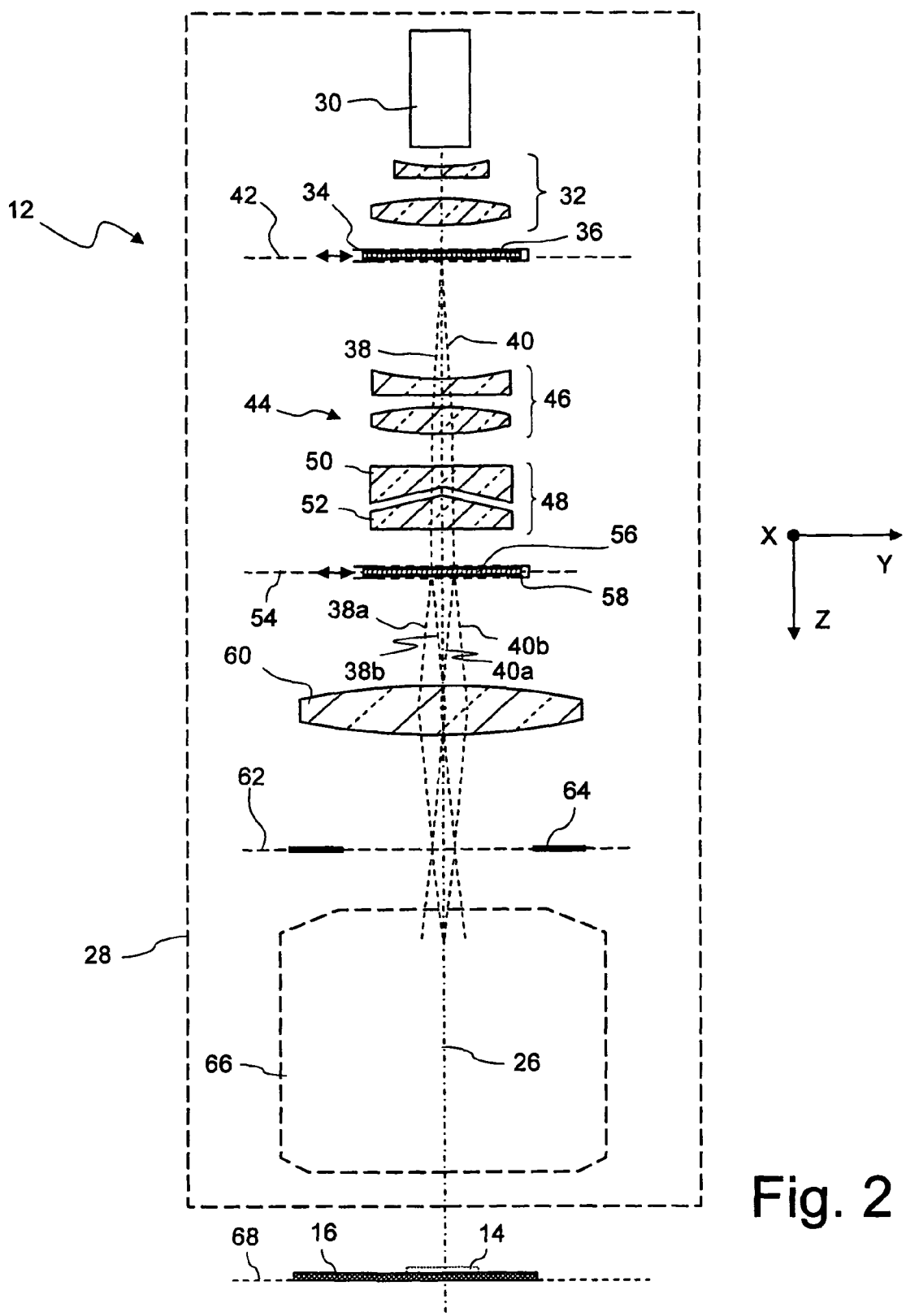
FIG. 2 is a simplified meridional section through the illumination system shown in FIG. 1.

FIG. 2 is a more detailed meridional section through the illumination system 12 shown in FIG. 1. For the sake of clarity, the illustration of FIG. 2 is also considerably simplified and not to scale. This particularly implies that different optical units are represented by very few optical elements only. In reality, these units may comprise significantly more lenses and other optical elements.

The illumination system 12 comprises a housing 28 and a light source that is, in the embodiment shown, realized as an excimer laser 30. The excimer laser 30 emits projection light that has a wavelength of about 193 nm. Other wavelengths, for example 248 nm or 157 nm, are also contemplated. The projection light emitted by the excimer laser 30 enters a beam expansion unit 32 in which the light bundle is expanded. After passing through the beam expansion unit 32, the projection light impinges on a first optical raster element 34. The first optical raster element 34 is received in a first exchange holder 36 so that it can easily be replaced by other optical raster elements having different properties. The first optical raster element 34 comprises, in the embodiment shown, one or more diffraction gratings that deflect each incident ray such that a divergence is introduced. This means that at each location on the optical raster element 34, light is diffracted within a certain range of angles. This range may extend, for example, from −3° to +3°. In FIG. 2 this is schematically represented for an axial ray that is split into two diverging rays 38, 40. The first optical raster element 34 thus modifies the angular distribution of the projection light and influences the local intensity distribution in a subsequent pupil plane. Other kinds of optical raster elements, for example micro-lens arrays, may be used instead or additionally.

The first optical raster element 34 is positioned in an object plane 42 of an objective 44 that is indicated by a zoom lens group 46 and a pair 48 of axicon elements 50, 52 having opposing conical faces. If both axicon elements 50, 52 are in contact, the axicon pair 48 has the effect of a plate having parallel plane surfaces. If both elements 50, 52 are moved apart, the spacing between the axicon elements 50, 52 results in a shift of light energy radially outward. Since axicon elements are known as such in the art, these will not be explained here in further detail.

Reference numeral 54 denotes an exit pupil plane of the objective 44. A second optical raster element 56 comprising micro-lens arrays is received in a second exchange holder 58 that is positioned in or in close proximity to the exit pupil plane 54 of the objective 44. The second optical raster element 56, which preferably has a diameter of less than 150 mm, introduces a divergence for each point and influences the geometry of the illuminated field 14 on the mask 16. The divergence introduced by the second optical raster element 56 is schematically represented in FIG. 2 by divergent rays 38a, 38b and 40a, 40b for the impinging rays 38 and 40. If the illuminated field 14 has the shape of a curved slit as is shown in FIG. 1, the exit side numerical aperture of the second optical raster element 56 may be in the range from 0.28 to 0.35 in the X-direction and in the range from 0.07 to 0.09 in the Y-direction.

The diverging rays 38a, 38b and 40a, 40b emerging from the second optical raster element 56 enter a condenser 60 that is represented in FIG. 2 by a single lens element for the sake of simplicity. Various embodiments of the condenser 60 will be explained in more detail below with reference to FIGS. 3 to 8.

The entrance pupil plane of the condenser 60 coincides with the exit pupil plane 54 of the objective 44. An image plane 62 of the condenser 60 is a field plane, close to which a field stop 64 is positioned. A field stop objective 66 images the field stop 64 onto a mask plane 68 in which the mask 16 is positioned. The field stop 64 ensures sharp edges of the illuminated field 14 at least for the short lateral sides extending along the Y-direction.

In the following various embodiments of the condenser 60 will be described with reference to FIGS. 3 to 8.

Figure 3:
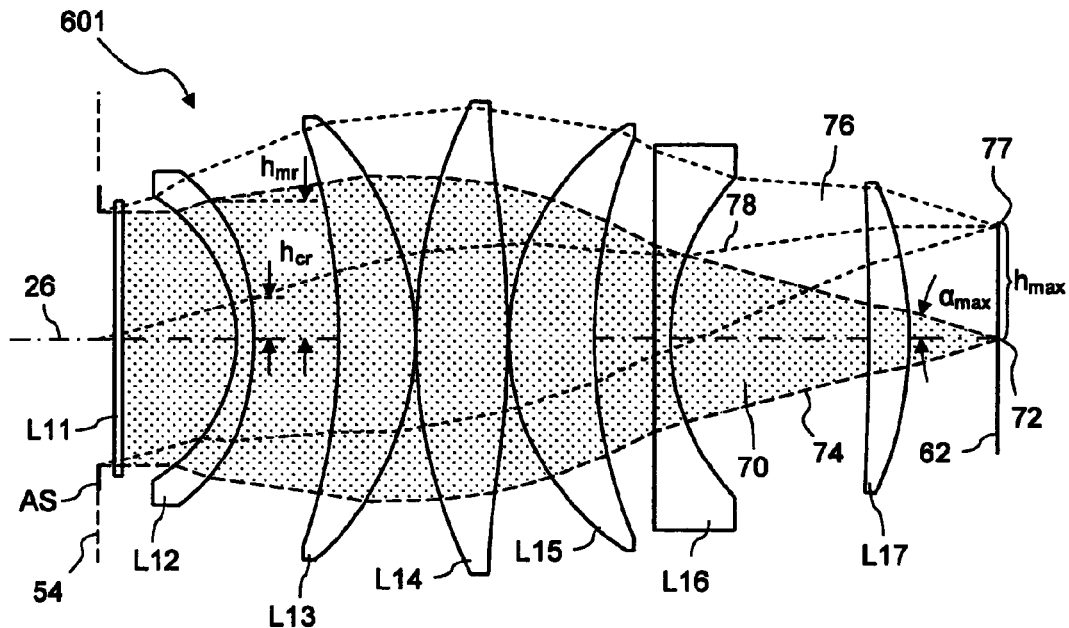
FIG. 3 is a meridional section through a condenser according to a first embodiment of the invention.

FIG. 3 shows a meridional section of a first embodiment of the condenser 60 that is denoted in its entirety by 601. An aperture stop AS arranged in the pupil plane 54 may be formed by the rim of the second optical raster element 56. The pupil of the condenser 601 has a diameter of about 125 mm. The condenser 601 fourier-transforms the pupil to a field having a diameter of about 110 mm. The overall focal length of the condenser 601 is about 208 mm, and the image side numerical aperture is about 0.3. These values also apply to the other embodiments described further below.

Immediately behind the pupil plane 54 a first lens formed as a thin planar plate L11 made of quartz glass is positioned. The thin plate L11 as such does not substantially contribute to the optical properties of the condenser 601. However, it may support various functional elements such as a grey filter, a diffusing surface or a structure designed to selectively modify the state of polarization 15 of traversing light rays. Depending upon the particular application, a plate L11 supporting a first functional element may be replaced by a plate L11' supporting another functional element. If no such functional element is desired at all, the plate L11 may be completely dispensed with. This entails only minor modifications of the optical design shown in FIG. 3.

Behind the plate L11 a second lens L12 is arranged that is formed as a negative meniscus lens having an aspherical convex rear surface. A third lens L13 is a positive meniscus lens having an aspherical convex rear surface. A fourth lens L14 is a bi-convex lens that also has an aspherical convex rear surface. A fifth lens L15 is a positive meniscus lens with a concave rear surface.

A sixth lens L16 is a planar concave lens. A seventh lens L17, which is the last lens of the condenser 601, is a positive meniscus lens with a slightly concave front surface.

In the embodiment shown, only the second lens L12 and the third lens L13 are made of $CaF_2$. All other lenses of the condenser 601 are made of quartz glass. This material selection is a good compromise in terms of costs and durability. Of course, other material could be envisaged as well and would entail only minor changes of the design. For example, the second lens L12 and the third lens L13 may be made of another cubic crystalline material, for example $BaF_2$, $SrF_2$, $LiF_2$ or $Ca_{1-x}Ba_xF_2$, and the other lenses may be made of other glasses, or all lenses could be made of $CaF_2$.

Table 1 contains the lens data of the condenser 601. The first column lists a surface number S# of all lenses of the condenser 601 in the order in which light propagates through the condenser 601 from the pupil plane 54 to the field plane 62. The second column lists the radius of curvature (in mm) for each surface S#. The third column lists the spacing between successive surfaces (in mm) along the optical axis 26. The fourth column indicates the material of all media having an index of refraction distinct from 1. The fifth column lists the ½ diameter of the lenses, and the sixth column contains the indices of refraction of the materials listed in the fourth column at the exposure wavelength of λ=193.38 nm.

TABLE 1

Lens data of embodiment #1

| S# | RADIUS | THICKNESS | MATE-RIAL | ½ Diameter | n(193.38) |
|---|---|---|---|---|---|
| 1 | ∞ | 8.0000 |  | 62.54 | 1.000000 |
| 2 | ∞ | 4.0000 | SI02 | 64.74 | 1.560305 |

TABLE 1-continued

Lens data of embodiment #1

| S# | RADIUS | THICKNESS | MATERIAL | ½ Diameter | n(193.38) |
|---|---|---|---|---|---|
| 3 | ∞ | 55.1717 | | 65.42 | 1.000000 |
| 4 | −81.16600 | 8.3549 | CAF2 | 69.70 | 1.501403 |
| 5* | −164.05507 | 40.8166 | | 79.53 | 1.000000 |
| 6 | −324.09000 | 36.6603 | CAF2 | 102.45 | 1.501403 |
| 7* | −131.96748 | 0.5000 | | 106.03 | 1.000000 |
| 8 | 269.95300 | 44.5830 | SIO2 | 113.39 | 1.560305 |
| 9* | −451.38253 | 0.5000 | | 112.38 | 1.000000 |
| 10 | 125.07200 | 41.5156 | SIO2 | 102.04 | 1.560305 |
| 11 | 264.01000 | 28.8790 | | 98.04 | 1.000000 |
| 12 | ∞ | 8.0000 | SIO2 | 92.07 | 1.560305 |
| 13 | 116.15500 | 95.5361 | | 78.63 | 1.000000 |
| 14 | −1778.95000 | 19.6342 | SIO2 | 73.90 | 1.560305 |
| 15 | −193.86600 | 42.8486 | | 73.68 | 1.000000 |

TABLE 2

Aspherical constants of embodiment #1

| S# | k | A | B | C | D |
|---|---|---|---|---|---|
| 5 | −0.71095E+00 | −0.25034E−06 | −0.11887E−10 | 0.37576E−15 | |
| 7 | −0.18656E+01 | −0.45117E−08 | 0.22449E−11 | −0.81255E−15 | 0.24090E−19 |
| 9 | 0.00000E+00 | −0.19790E−07 | 0.61213E−11 | −0.16935E−15 | |

Aspherical surfaces are indicated in column 1 by an asterisk. Table 2 contains the values for the conical coefficient k and the aspherical coefficients A, B, C, and D for these surfaces. The height z of a surface point parallel to the optical axis 26 is given by $$z = \frac{ch^2}{1 + \sqrt{1 - (1+k)c^2h^2}} + Ah^4 + Bh^6 + Ch^8 + Dh^{10}$$

with h being the radial distance from the optical axis 26 and c being the curvature of the respective surface.

The shaded area in FIG. 3 represents a coaxial light bundle 70 that converges towards an on-axis image point 72 in the field plane 62. The shape of the coaxial light bundle 70 is determined by marginal rays 74 that are indicated by broken lines and pass the aperture stop AS parallel to the optical axis 26.

Another pair of broken lines indicates a marginal light bundle 76 that converges towards an image point 77 that has a maximum height (i.e. distance) $h_{max}$ from the optical axis 26. The centre of the marginal light bundle 76 is formed by a chief ray 78 that intersects the optical axis 26 in the pupil plane 54 and passes the field plane 62 at the marginal image point 77.

The lenses L14, L15, L16 and L17 form a group of consecutive lenses in which the coaxial light bundle 70 is converging. This group contains three concave surfaces, namely the rear surfaces of lenses L15 and L16 and the front surface of lens L17. Apart from that, this group comprises a lens having a negative refractive power, namely the lens L16. This is a characteristic feature of the condenser 601 and contributes to the excellent optical properties that are discussed below with reference to Table 3.

In condenser 601 shown in FIG. 3, the aspherical surfaces on the lenses L13 and L14 contribute to correcting pupil related aberrations. The first aspherical surface on lens L12 is mainly used for correcting spherical aberration.

Table 3 contains a list of various quantities that characterize the optical quality of the various embodiments of the condenser 60 and are crucial for its use in an illumination system of a microlithographic exposure apparatus. Column 1 of Table 3 contains the values for these quantities for the condenser 601 that has been described above with reference to FIG. 3.

TABLE 3

Optical properties of embodiments #1 to #5

| | Embod. #1 | Embod. #2 | Embod. #3 | Embod. #4 | Embod. #5 |
|---|---|---|---|---|---|
| Image side numerical aperture $NA_i$ | 0.3 | 0.3 | 0.3 | 0.3 | 0.3 |
| Geometrical optical flux [mm] | 16.5 | 16.5 | 16.6 | 16.6 | 16.6 |

TABLE 3-continued

Optical properties of embodiments #1 to #5

| | Embod. #1 | Embod. #2 | Embod. #3 | Embod. #4 | Embod. #5 |
|---|---|---|---|---|---|
| Telecentricity error [mrad] | 0.1 | 0.2 | 0.3 | 0.2 | 1.7 |
| Proximity $P_{first}$ of first aspherical surface to pupil plane | 3.5 | 7.5 | 7.5 | 7.5 | 0.66 |
| Proximity $P_{last}$ of last aspherical surface to field plane | 0.6 | 1.9 | 1.6 | 1.5 | 2.0 |
| Maximum deviation Δd from sine condition | ±0.004 | ±0.004 | ±0.005 | ±0.007 | ±0.035 |

In the following the various quantities listed in Table 3 will be briefly explained and discussed.

The image side numerical aperture $NA_i$ listed in row 1 is defined as the product of the index of refraction of the medium between the condenser 601 and the field plane 62 on the one hand and the maximum aperture angle on the other hand. In FIG. 3 this angle is formed between the optical axis 26 and a marginal ray 74 when it passes through the field plane 62.

The geometrical optical flux, which is listed in row 2 of Table 3, is defined as the product of the image side numerical aperture $NA_i$ and the maximum image height $h_{max}$. With growing geometrical optical fluxes it becomes more and more difficult to obtain an optical system that meets the tight specifications that prevail in microlithographic exposure tools.

Row 3 of Table 3 lists the telecentricity error on the object side of the condensers according to the embodiment 1 to 5. The telecentricity error relates to the maximum angle formed between a chief ray, i.e. a ray that crosses the optical axis in the pupil plane 54 such as chief ray 78, and the optical axis 26 in the field plane 62. In an optical system that is perfectly telecentric on its object side, this angle equals 0° for all chief rays. This means that the chief rays are collimated in the object plane.

Row 4 of Table 3 relates to the proximity $P_{first}$ of the aspherical surface that is closest to the pupil plane 54. This proximity $P_{first}$ is a figure of merit, because the effect of an aspherical surface for correcting spherical aberration increases with decreasing distance from the pupil plane.

The proximity $P_{first}$ is defined as the ratio of the height $h_{mr}$ of the marginal rays 74 of the coaxial light bundle 70 to the height $h_{cr}$ of the chief ray 78 that impinges on the marginal image point 77. The heights $h_{mr}$ and $h_{cr}$ denote the distances between the optical axis 26 and the point where the respective ray penetrates the aspherical surface that is closest to the pupil plane 54. In FIG. 3, this is the rear surface of the lens L12. The larger this ratio $P_{first}$ is, the closer is the aspherical surface positioned to the pupil plane 54.

Row 5 of Table 3 contains values for a quantity $P_{last}$ that is characteristic of the proximity of the aspherical surface that is closest to the field plane 62. This proximity $P_{last}$ is also a figure of merit, because the effect of an aspherical surface for correcting pupil related aberrations increases with decreasing distance from the field plane.

The proximity $P_{last}$ is defined as $1/P_{first} = h_{cr}/h_{mr}$. Thus a large value for $P_{last}$ indicates that the last aspherical surface is arranged in close proximity to the field plane 62.

Row 6 of Table 3 relates to the deviations $\Delta d$ from the sine condition. The sine condition deviation $\Delta d$ is defined by $$\sin(\alpha) = p/((1+\Delta x) \cdot f),$$

where f is the focal length of the condenser 601, $\alpha$ is the angle of incidence of the light ray impinging on an arbitrary illuminated field point in the field plane 62, and p is the distance between the optical axis 26 of the condenser and a pupil point at which the light ray passes the pupil plane 54. For an axial point in the pupil plane 54, p=0 which results in normal incidence. For a pupil point on the diameter of the pupil, $p = p_{max}$ and $\alpha$ has its maximum value $\alpha_{max}$, too (see FIG. 3). Ideally, the sine condition is perfectly fulfilled (i.e. $\Delta x=0$) for all angles of incidence and also for all field points.

As can be seen from Table 3, the condenser 601 has excellent optical qualities, particularly as far as the telecentricity error and the sine condition is concerned.

Apart from that, the condenser 601 has a very good pole balance and a small gradient of the irradiance. A sine condition deviation $|\Delta x|=0.004$ is an excellent value that has to be compared to conventional condensers having sine condition deviations $\Delta x > 0.02$.

Apart from that, the condenser 601 has a good pole balance and a small gradient of the irradiance. More particularly, the condenser 601 produces in the field plane 62 a very uniform irradiance distribution I(x) along the X direction (cross-scan direction). This can be expressed by the ratio $\Delta I_{max}/I(x)$, where $\Delta I_{max}$ denotes the maximum fluctuations of the irradiance along the X direction. With the condenser 601, as well as with the other condensers described hereinafter, the ratio $\Delta I_{max}/I(x)$ is smaller than 0.5% irrespective of the selected illumination setting. Along the Y direction a non-uniform irradiance distribution may be deliberately produced for other reasons, for example in order to reduce the pulse quantization effect.

Figure 4:
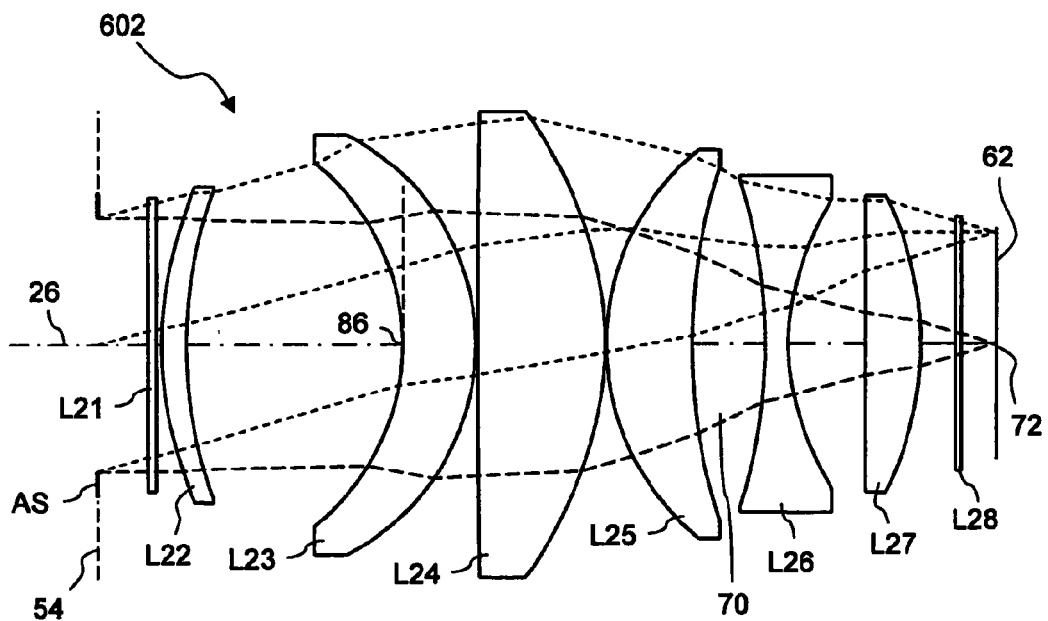
FIG. 4 is a meridional section through a condenser according to a second embodiment of the invention.

FIG. 4 shows a second embodiment of a condenser 60 which is denoted in its entirety by 602. The lens data and the aspherical constants are given in Table 4 and 5, respectively.

TABLE 4

Lens data of embodiment #2

| S# | RADIUS | THICKNESS | MATERIAL | ½ Diameter | n(193.38) |
|---|---|---|---|---|---|
| 1 | ∞ | 25.0000 | | 62.54 | 1.000000 |
| 2 | ∞ | 4.0000 | CAF2 | 69.40 | 1.501484 |
| 3 | ∞ | 2.5000 | | 70.12 | 1.000000 |
| 4* | 172.07456 | 12.3100 | CAF2 | 74.95 | 1.501484 |
| 5 | 222.75300 | 103.7810 | | 75.53 | 1.000000 |
| 6 | −117.16460 | 35.0000 | SI02 | 89.65 | 1.560293 |
| 7 | −118.84730 | 1.1540 | | 101.02 | 1.000000 |
| 8 | 7987.00000 | 62.2400 | SI02 | 109.90 | 1.560293 |
| 9* | −161.38341 | 0.5000 | | 112.21 | 1.000000 |
| 10 | 126.36700 | 41.4500 | SI02 | 93.52 | 1.560293 |
| 11 | 298.55400 | 35.3040 | | 87.00 | 1.000000 |
| 12 | −276.67400 | 11.0000 | SI02 | 80.51 | 1.560293 |
| 13* | 111.64295 | 37.3149 | | 71.13 | 1.000000 |
| 14 | ∞ | 26.6900 | SI02 | 70.80 | 1.560293 |
| 15 | −168.13720 | 16.7565 | | 70.66 | 1.000000 |
| 16 | ∞ | 3.0500 | SI02 | 60.45 | 1.560293 |
| 17 | ∞ | 16.9500 | | 59.85 | 1.000000 |

TABLE 5

Aspherical constants of embodiment #2

| S# | k | A | B | C | D |
|---|---|---|---|---|---|
| 4 | 0.84843E+00 | −0.57629E−07 | −0.41326E−11 | −0.41876E−15 | −0.21243E−20 |
| 9 | −0.74026E+00 | 0.41420E−07 | −0.18061E−11 | 0.66307E−16 | −0.22252E−20 |
| 13 | −0.99518E+00 | −0.12832E−06 | 0.23043E−10 | −0.22350E−14 | 0.81039E−19 |

The condenser 602 comprises two thin plates L21, L28, which have a similar function as the plate L11 of the condenser 601 shown in FIG. 3, and a positive meniscus lens L22 having an aspherical front surface. The following lens L23 is a meniscus lens having surfaces with almost identical curvatures. Lens L24 is a positive lens with an almost planar front surface and an aspherical rear surface. Lens L25 is again a meniscus lens having a positive refractive power. Lens L26 is a negative bi-concave lens, and lens L27 is a planar convex lens. Reference numeral L28 denotes another flat plate that has a similar function as the plates L11 or L21 mentioned above, but with the difference that it is arranged very close to the field plane 62. Thus the plate L28 may be used for manipulating those properties that should be modified in or in close proximity of a field plane.

The lenses L24 to L28 form a group of lenses in which the coaxial light bundle 702 converges. Within this group of lenses, there are three concave surfaces and one negative lens, namely lens L26. As can be seen from Table 3, the optical properties of the condenser 602 are comparable to the optical properties of the condenser 601 shown in FIG. 3.

A further advantage of the condenser 602 is, compared to the condenser 601 or condensers known in the prior art, that (apart from the plate L21) there is only one lens, namely lens L22, that is arranged in close proximity to the aperture stop AS. To be more precise, the object side vertex 86 of the front surface of the lens L23 is spaced apart by a distance from the pupil plane 54 being so large that the ratio $h_{mr}/h_{cr}$ is smaller than 1.7.

This is advantageous for the following reason: If the pupil plane is not homogeneously illuminated, for example, if a dipole setting is used, particularly high intensities may occur in those lenses that are arranged in the immediate vicinity of the pupil plane. Since quartz glass or other conventional lens materials suffer from considerable deteriorations in the presence of such high intensities, it is often advantageous to use $CaF_2$ or a similar cubic crystal as lens material for these lenses, since $CaF_2$ has a higher transmittance for DUV projection light and is less sensitive to degradations caused by high light intensities. On the other hand, $CaF_2$ is a very expensive material, and therefore its use should be restricted to those cases in which it is indispensable.

If there is only one lens arranged in close proximity to the pupil plane, here lens L22, it suffices to select $CaF_2$ as lens material only for this one lens. All other lenses L23 to L28 may be made of quartz glass or another comparatively cheap material, since they are relatively far away from the pupil plane and are thus not subject to the aforementioned deteriorations.

In order to obtain optical properties that are comparable to the first embodiment, the condenser 602 requires not only three but four aspherical surfaces.

Figure 5:
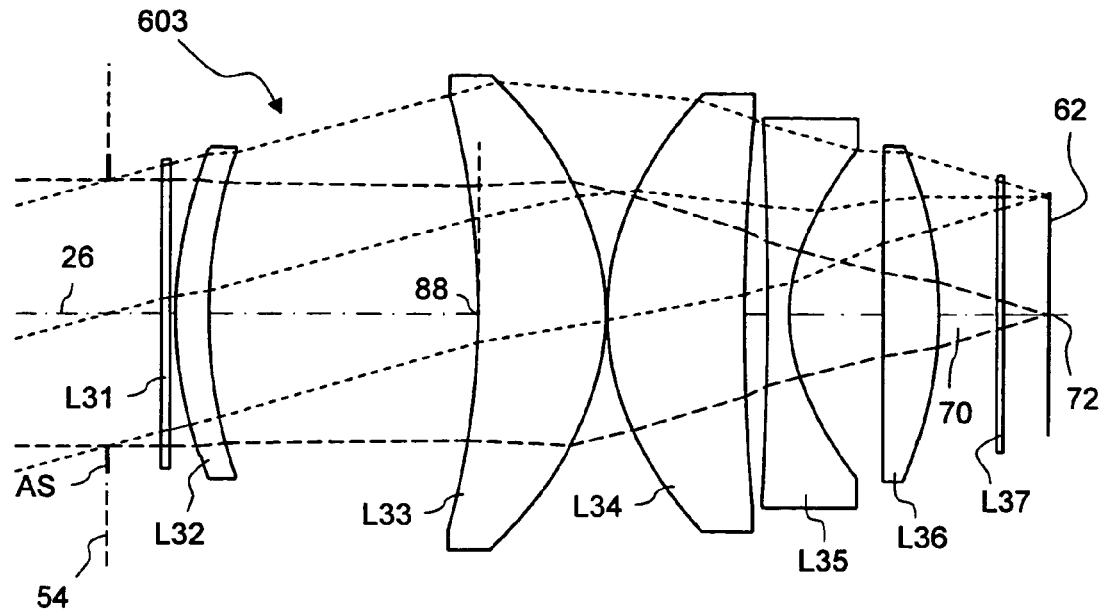
FIG. 5 is a meridional section through a condenser according to a third embodiment of the invention.

FIG. 5 shows a meridional section through a condenser 603 according to a third embodiment. The lens data and the aspherical constants are given in Tables 6 and 7, respectively.

The condenser 603 is, both in terms of optical design and optical properties (cf. Table 3), comparable to the condenser 602. However, the lenses L23 and L24 are combined to form a single thick meniscus lens L33. Only the plate L31 and the first thin meniscus lens L32 are made of $CaF_2$ or a similar material. All other optical elements of the condenser 603 may be made of a conventional lens material such as quartz glass.

TABLE 6

Lens data of embodiment #3

| S# | RADIUS | THICKNESS | MATE-RIAL | ½ Diameter | n(193.38) |
|---|---|---|---|---|---|
| 1 | ∞ | 25.0000 | | 64.86 | 1.000000 |
| 2 | ∞ | 4.0000 | CAF2 | 71.72 | 1.501484 |
| 3 | ∞ | 2.5000 | | 72.43 | 1.000000 |
| 4* | 200.04110 | 14.5000 | CAF2 | 77.08 | 1.501484 |
| 5 | 233.03400 | 124.6858 | | 77.77 | 1.000000 |
| 6 | −389.10600 | 60.0000 | SI02 | 104.66 | 1.560293 |
| 7* | −114.20352 | 0.5000 | | 110.58 | 1.000000 |
| 8* | 128.28959 | 62.8300 | SI02 | 101.09 | 1.560293 |
| 9 | 1000.17000 | 11.0902 | | 92.72 | 1.000000 |
| 10 | −1778.96000 | 10.0000 | SI02 | 90.56 | 1.560293 |

TABLE 6-continued

Lens data of embodiment #3

| S# | RADIUS | THICKNESS | MATE-RIAL | ½ Diameter | n(193.38) |
|---|---|---|---|---|---|
| 11* | 83.50000 | 43.1940 | | 78.62 | 1.000000 |
| 12 | ∞ | 25.7000 | SI02 | 78.38 | 1.560293 |
| 13 | −198.36600 | 127.0000 | | 78.24 | 1.000000 |
| 14 | ∞ | 3.0500 | SI02 | 65.72 | 1.560293 |
| 15 | ∞ | 20.9500 | | 65.16 | 1.000000 |
| 16 | ∞ | 0.0000 | | 59.48 | 1.000000 |

TABLE 7

Aspherical constants of embodiment #3

| S# | k | A | B | C | D |
|---|---|---|---|---|---|
| 4 | 0.00000E+00 | −0.41303E−08 | −0.29279E−11 | −0.71705E−15 | 0.83815E−19 |
| 7 | −0.68105E+00 | 0.56622E−07 | −0.16891E−11 | −0.36668E−16 | 0.24541E−20 |
| 8 | −0.58533E−01 | −0.43568E−07 | 0.12312E−11 | −0.28884E−15 | |
| 11 | −0.83269E+00 | −0.29382E−06 | 0.39629E−10 | −0.42228E−14 | 0.19031E−18 |

The vertex 88 of the front surface of the second curved lens, namely lens L33, is arranged at such a large distance from the aperture stop AS that the ratio $h_{mr/hcr}$ is smaller than 1.4. This means that the lens L33 is sufficiently far away from the pupil plane so that it can be made of quartz glass without taking the risk of incurring lifetime degradations due to high intensities in the vicinity of the pupil plane.

Figure 6:
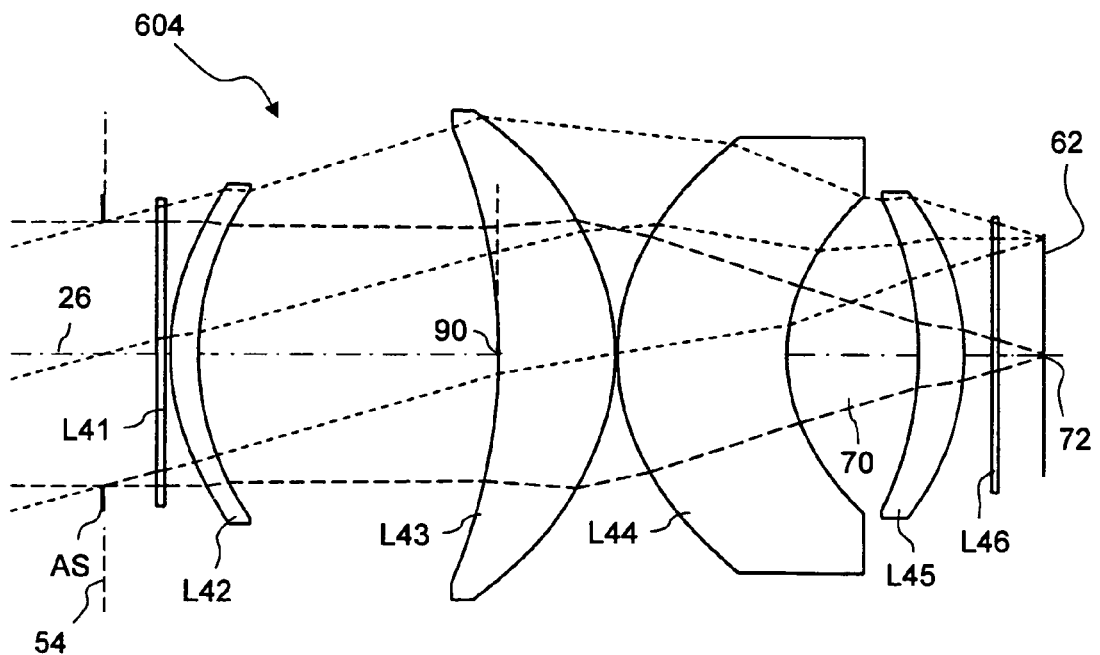
FIG. 6 is a meridional section through a condenser according to a fourth embodiment of the invention.

FIG. 6 shows a meridional section through a condenser 604 according to a fourth embodiment. The lens data and the aspherical constants are given in Tables 8 and 9, respectively.

TABLE 8

Lens data of embodiment #4

| S# | RADIUS | THICKNESS | MATE-RIAL | ½ Diameter | n(193.38) |
|---|---|---|---|---|---|
| 1 | ∞ | 25.0000 | | 58.39 | 1.000000 |
| 2 | ∞ | 4.0000 | CAF2 | 65.70 | 1.501484 |
| 3 | ∞ | 2.5000 | | 66.47 | 1.000000 |
| 4* | 123.94289 | 12.0000 | CAF2 | 73.72 | 1.501484 |
| 5 | 136.47905 | 139.1226 | | 73.44 | 1.000000 |
| 6 | −272.90199 | 54.5413 | SI02 | 105.44 | 1.560293 |
| 7* | −112.50000 | 1.0000 | | 111.00 | 1.000000 |
| 8* | 107.44500 | 78.1296 | SI02 | 101.29 | 1.560293 |
| 9* | 84.84697 | 60.7565 | | 76.60 | 1.000000 |
| 10 | −166.37753 | 20.9500 | SI02 | 75.96 | 1.560293 |
| 11 | −127.37113 | 13.0000 | | 77.39 | 1.000000 |
| 12 | ∞ | 3.0500 | SI02 | 65.86 | 1.560293 |
| 13 | ∞ | 20.9500 | | 65.30 | 1.000000 |
| 14 | ∞ | 0.0000 | | 59.13 | 1.000000 |

TABLE 9

Aspherical constants of embodiment #4

| S# | k | A | B | C | D |
|---|---|---|---|---|---|
| 4 | 0.00000E+00 | −0.14901E−07 | −0.27484E−11 | −0.24789E−14 | 0.22153E−18 |
| 7 | −0.94802E+00 | 0.25005E−08 | −0.28140E−11 | 0.54836E−16 | −0.45626E−20 |
| 8 | −0.50760E+00 | 0.41660E−08 | −0.24133E−12 | 0.17317E−15 | −0.27544E−19 |
| 9 | −0.38355E+00 | −0.14660E−06 | 0.19333E−10 | −0.99009E−15 | −0.19324E−18 |

The condenser 604 is, both in terms of optical design and optical properties (cf. Table 3), comparable to the condensers 602 and 603 according to the embodiments 2 and 3, respectively. The thick meniscus lens L44 of the condenser 604 may be envisaged as a combination of the lenses L34 and L35 of the condenser 603. Thus the condenser 604 requires only eight curved surfaces, from which four surfaces are aspherical. The ratio $h_{mr}/h_{cr}$ at the vertex 90 of the second curved lens (lens L43) is as low as about 1.3.

Figure 7:
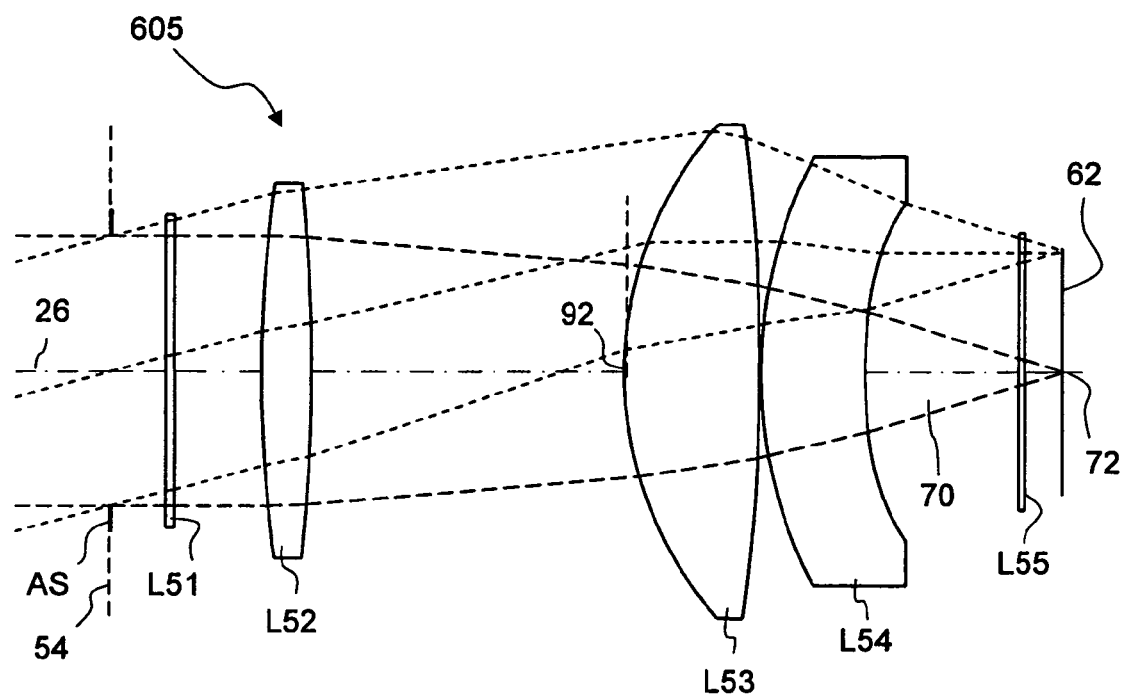
FIG. 7 is a meridional section through a condenser according to a fifth embodiment of the invention.

FIG. 7 shows a meridional section through a condenser 605 according to a fifth embodiment. The lens data and the aspherical constants are given in Tables 10 and 11, respectively.

TABLE 10

Lens data of embodiment #5

| S# | RADIUS | THICKNESS | MATERIAL | ½ Diameter | n(193.38) |
|---|---|---|---|---|---|
| 1 | ∞ | 0.0000 | | 58.39 | 1.000000 |
| 2 | ∞ | 25.0000 | | 58.39 | 1.000000 |
| 3 | ∞ | 4.0000 | CAF2 | 65.70 | 1.501484 |
| 4 | ∞ | 40.0000 | | 66.47 | 1.000000 |
| 5 | 641.51121 | 23.0000 | CAF2 | 79.61 | 1.501484 |
| 6 | −824.68499 | 142.6544 | | 81.64 | 1.000000 |
| 7 | 175.43433 | 62.0000 | SIO2 | 113.12 | 1.560293 |
| 8* | −1808.45841 | 1.0000 | | 110.44 | 1.000000 |
| 9 | 220.27637 | 47.5734 | SIO2 | 98.21 | 1.560293 |
| 10* | 280.26962 | 69.7722 | | 79.49 | 1.000000 |
| 11 | ∞ | 3.0500 | SIO2 | 64.99 | 1.560293 |
| 12 | ∞ | 16.9500 | | 64.44 | 1.000000 |
| 13 | ∞ | 0.0000 | | 59.68 | 1.000000 |

TABLE 11

Aspherical constants of embodiment #5

| S# | k | A | B | C | D |
|---|---|---|---|---|---|
| 8 | −0.68105E+00 | −0.73068E−07 | 0.73361E−11 | −0.35149E−15 | 0.71240E−20 |
| 10 | −0.83269E+00 | 0.16320E−06 | 0.11279E−10 | −0.31948E−14 | 0.32841E−18 |

Apart from two flat plates L51, L55 the condenser 605 comprises only three lenses, namely a thin bi-convex lens L52, a thick bi-convex lens L53 and a thick negative meniscus lens L54. Only the rear surfaces of the lenses L53 and L54 are aspherical. The vertex of the front surface of the second lens is denoted by 92.

The lens L52 is made of $CaF_2$, whereas the other two lenses L53, L54 are made of quartz glass. Again, other materials are contemplated as well.

As can be seen from Table 3, the particularly simple design of the condenser 605 results in optical properties that are, in comparison to the embodiments 1 to 4, slightly inferior. However, in comparison to condensers known in the prior art, the condenser 605 has still much better values for the gradient of irradiance.

Figure 8:
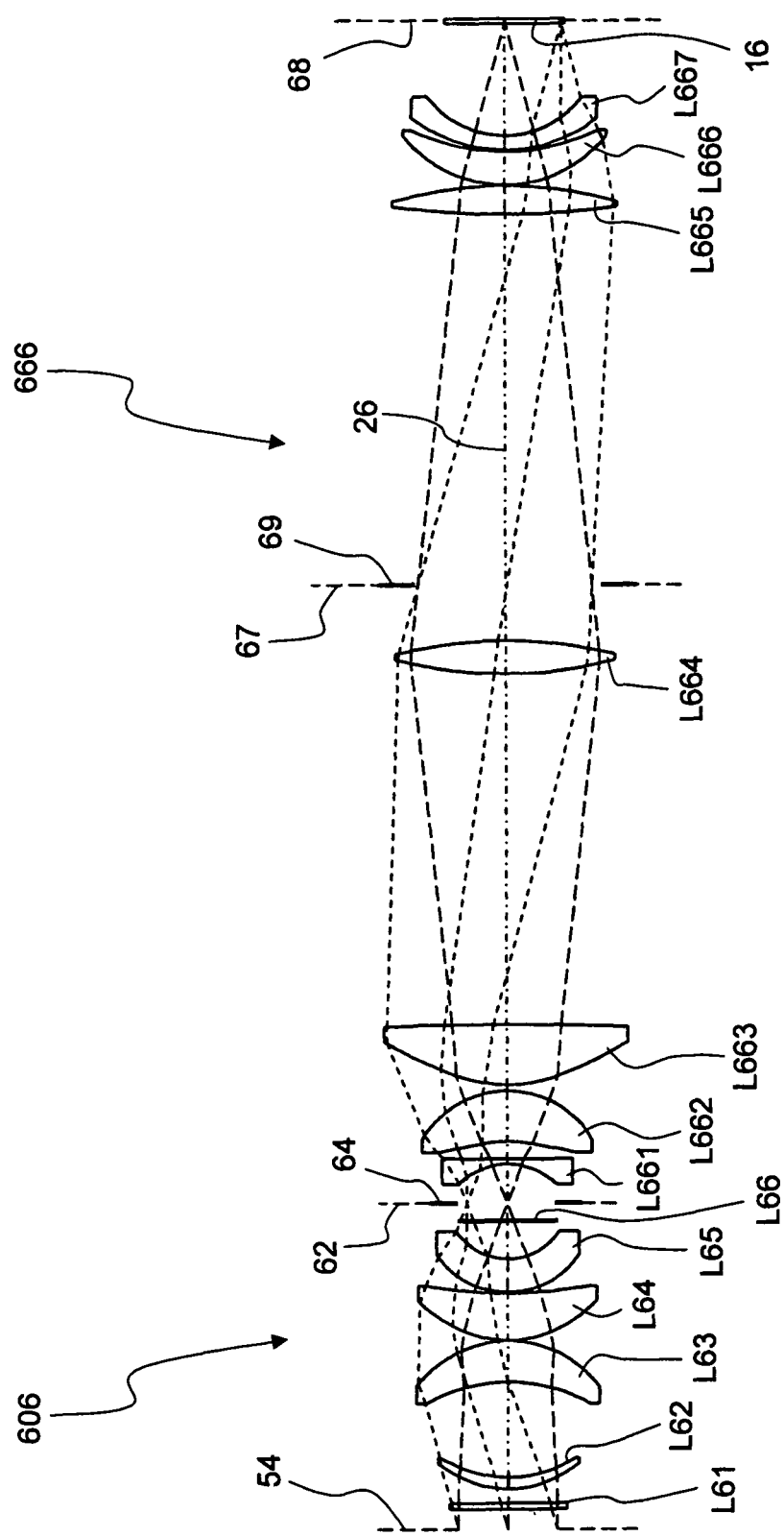
FIG. 8 is a meridional section through a condenser and a subsequent field stop objective.

FIG. 8 shows a meridional section through a condenser 606 and a field stop objective 666 according to a sixth embodiment. The lens data and the aspherical constants of both optical subsystems are given in tables 12 and 13, respectively. Aspherical surfaces are indicated in column 1 by an asterisk.

The condenser 606 comprises two flat plates L61 and L66 having a similar function as the plate L11 of the condenser 601 shown in FIG. 3. The condenser 606 further comprises a thin positive meniscus lens L62 having an aspherical convex front surface, a thick positive meniscus lens L63 having an aspherical convex rear surface, a thick positive meniscus lens L64 having an aspherical convex front surface, and a thick negative meniscus lens L65 having an aspherical convex front surface.

The first curved lens L62 of the condenser 606 is positioned in close proximity to the pupil plane 54. The proximity $P_{first}$ of the first aspherical surface of the condenser 606 to the pupil plane 54 is about 4.5. As a result, this surface is able to effectively correct spherical aberration. Due to the small spherical aberration, the condenser 606 focuses a parallel light bundle traversing the pupil plane 54 onto a spot in the field stop plane 62 having a spot diameter of less than 1.2 mm.

TABLE 12

Lens data of embodiment #6

| S# | RADIUS | THICKNESS | MATERIAL | ½ Diameter |
|---|---|---|---|---|
| 1 | ∞ | 26.0000 | | 68.01 |
| 2 | ∞ | 8.5000 | SIO2N2 | 75.98 |
| 3 | ∞ | 0.0000 | | 77.61 |

TABLE 12-continued

Lens data of embodiment #6

| S# | RADIUS | THICKNESS | MATERIAL | ½ Diameter |
|---|---|---|---|---|
| 4 | ∞ | 0.0000 | | 77.61 |
| 5 | ∞ | 18.8537 | | 77.61 |
| 6* | 129.50687 | 15.7952 | CAF2N2 | 93.96 |
| 7 | 167.44939 | 126.8379 | | 93.31 |
| 8 | −216.15718 | 55.3914 | SIO2N2 | 111.23 |
| 9* | −141.69001 | 0.5000 | | 120.81 |
| 10* | 143.92703 | 63.9518 | SIO2N2 | 116.39 |
| 11 | 649.68828 | 1.0000 | | 109.02 |
| 12* | 114.58152 | 44.8627 | SIO2N2 | 91.94 |
| 13 | 80.01238 | 49.5988 | | 67.37 |
| 14 | ∞ | 3.0500 | SIO2N2 | 62.23 |

TABLE 12-continued

Lens data of embodiment #6

| S# | RADIUS | THICKNESS | MATERIAL | ½ Diameter |
|---|---|---|---|---|
| 15 | ∞ | 20.9500 | | 61.49 |
| 16 | ∞ | 0.0000 | | 53.80 |
| 17 | ∞ | 53.4233 | | 53.80 |
| 18 | −92.21665 | 7.0000 | SIO2N2 | 64.65 |
| 19 | 6178.26989 | 23.0715 | | 84.54 |
| 20* | −172.55434 | 68.1962 | SIO2N2 | 94.41 |
| 21 | −129.51211 | 7.9100 | | 110.22 |
| 22 | ∞ | 0.0000 | | 138.32 |
| 23 | ∞ | 0.0000 | | 138.32 |
| 24* | 167.33230 | 81.0899 | SIO2N2 | 161.97 |
| 25 | −4477.98704 | 472.1477 | | 161.88 |
| 26 | 561.06993 | 44.9138 | CAF2N2 | 148.26 |
| 27* | −511.25943 | 74.9280 | | 147.53 |
| 28 | ∞ | 248.4590 | | 120.96 |
| 29 | ∞ | 248.4524 | | 199.62 |
| 30 | 1076.99100 | 38.1025 | SIO2N2 | 147.25 |
| 31* | −502.36323 | 1.0000 | | 147.13 |
| 32 | 170.98764 | 44.7778 | SIO2N2 | 131.69 |
| 33 | 287.63431 | 2.0000 | | 125.88 |
| 34 | 200.11077 | 19.2090 | SIO2N2 | 119.65 |
| 35 | 128.37087 | 149.1988 | | 102.22 |
| 36 | ∞ | 6.3000 | SIO2N2 | 75.77 |
| 37 | ∞ | 0.0000 | | 75.20 |

As a result of the proximity of the lens L62 to the pupil plane 54, high projection light intensities may locally occur that could ultimately result in material degradations. In order to prevent such degradations, the lens L62 is, in the embodiment shown, made of $CaF_2$ or another optical material having a very high transmission for projection light wavelengths below 200 nm. However, it is also possible to position the lens L62 further away from the pupil plane 54. This reduces the maximum light intensities so that the lens L62 may be made of a material having a higher absorption in the contemplated wavelength range. If the light source 30 of the illumination system 12 produces projection light with a wavelength above 200 nm, a conventional optical material such as $SiO_2$ may be used instead. Shifting the lens L62 away from the pupil plane 52 implies only insignificant modifications of the design of the condenser 606, but may increase the spot diameter.

TABLE 13

Aspherical constants of embodiment #6

| S# | k | A | B | C | D |
|---|---|---|---|---|---|
| 6 | −0.32913E+00 | −0.21551E−07 | −0.25629E−11 | 0.16252E−16 | |
| 9 | −0.74354E−01 | 0.24543E−07 | −0.13570E−11 | 0.80765E−16 | |
| 10 | −0.50117E+00 | 0.12506E−07 | −0.19246E−11 | 0.56157E−16 | |
| 12 | 0.12133E−01 | 0.27417E−08 | −0.24918E−12 | 0.12276E−15 | 0.93461E−20 |
| 20 | −0.54984E+01 | 0.13596E−06 | −0.13388E−10 | 0.82432E−15 | −0.20423E−19 |
| 24 | −0.42892E+01 | 0.16203E−07 | −0.42640E−12 | 0.91798E−17 | −0.10444E−21 |
| 27 | −0.22484E+02 | −0.12014E−07 | 0.46833E−12 | −0.65235E−17 | |
| 31 | −0.13984E−01 | 0.14072E−08 | 0.49095E−13 | −0.15999E−18 | |

If the spot diameter in the field plane 62 is allowed to significantly exceed the value of 1.2 mm, the lens L62 may be completely dispensed with. In this case (not shown) the condenser 606 comprises only the three thick meniscus lenses L63, L64 and L65 (apart from the plates L61 and L66).

The field stop objective 666 images the field stop 64 arranged in the field plane 62 onto the mask plane 68. In the embodiment shown, the field stop objective 666 comprises a first negative bi-concave lens L661 with an only weakly curved rear surface. Behind the lens L661 a thick positive meniscus lens L662 having an aspherical concave front surface is arranged. The field stop objective 666 further comprises a bi-convex lens L663 having an aspherical front surface, a bi-convex lens L664 having an aspherical rear surface, a bi-convex lens L665 having an aspherical rear surface, a positive meniscus lens L666 and a negative meniscus lens L667.

The first four lenses L661 to L664 of the field stop objective 666 transform the field plane 62 into a pupil plane 67 of the field stop objective 666. The last three lenses L665, L666 and L667 transform the pupil plane 67 of the field stop objective 666 into the mask plane 68.

The curved optical surfaces that are positioned closest to the field stop plane 62, i.e. the rear surface of the lens L65 and the front surface of the lens L661, are both concave. More particularly, these surfaces are almost concentric with respect to an axial point on the field plane 62. This means that the center of curvature of each concave surface coincides, at least to a certain degree, with this axial point in the field plane 62. For both surfaces the radius of curvature deviates from the axial distance of the respective surface from the field plane 62 by less than 1.75. Generally it is advantageous if this ratio does not exceed the value of 2.5. Further, the radii of curvature have similar magnitudes for both adjacent surfaces. In the embodiment shown, these magnitudes differ by less than 15%.

According to table 12 the axial distance between the field plane 62 and the lens L661 is 53.4233 mm. The radius of curvature should not exceed approximately 133 mm. This ensures small angles of incidence and thus less optical aberrations.

However, such a design may cause, at least for small conventional illumination settings, an increased double reflex ratio. The double reflex ratio relates to the amount of light that is reflected on the front surface of the mask 16, propagates back into the field stop objective 666 and is once again reflected at an optical surface such that it impinges on the mask 16, thereby disturbing the intensity uniformity on the mask 16. However, the double-reflected light is distributed over the entire pupil plane 67 of the field stop objective 666 so that it can be eliminated by a suitable diaphragm 69 positioned in the pupil plane 67. Such a diaphragm 69 makes it possible to reduce the intensity of the double-reflected light by about one or even two orders of magnitude. If the illumination setting is (also) adjusted by the diaphragm 69 in the pupil plane 67, the position of the diaphragm 69 and the diameter of its aperture should be determined by simulation.

In the embodiment shown in FIG. 8, the first lens L661 of the field stop objective 666 is bi-concave. However, it may also be formed by a concave-convex lens. This may be advantageous if the working distance between the field stop plane 62 and the field stop objective 666 shall be increased. The larger the working distance is, the more may the radius of curvature of the front surface of the lens L661 approach its axial distance with regard to the field plane 62. A larger working distance, however, results also in an increased clear aperture of the first three lenses L661, L662 and L663 positioned close to the field plane 62. This increases costs so that a reasonable trade-off has to be found between a large working distance on the one hand and costs on the other hand.

Due to the small height of the marginal rays at the first lens L661 of the field stop objective 666, this lens introduces only a small amount of spherical aberration and coma.

The pupil plane 67 within the field stop objective 666 is corrected with regard to coma and oblique spherical aberration. A correction of astigmatism is not necessary. The diaphragm 69 may be positioned in the tangential focal plane where the marginal ray and the coma ray intersect each other. In spite of a small spot diameter in the mask plane 68 of less than 0.4 mm, field dependent effects of the telecentricity, the uniformity and the ellipticity may be observed if the diaphragm 69 stops a significant amount of light. For reducing these effects, the diaphragm 69 may be axially shifted from its geometrical position by up to ±0.5 mm.

The diaphragm 69 in the pupil plane 67 is usually designed for the maximum numerical aperture NA of the illumination system 12. For reducing the numerical aperture NA to smaller values, the aperture diameter of the diaphragm 69 may be varied and/or the position of the diaphragm 69 may be shifted along the optical axis 26.

The absolute value of the negative refractive power of the last lens L667 of the field stop objective 666 is larger than the value of the positive refractive power of the preceeding lens L666. This causes an over-correction of the spherical pupil aberration. As a result of the larger heights of the principal rays on the positive lens L666, the overall refractive power of the combination of the lens L666 and L667 is nevertheless positive.

Figure 9:
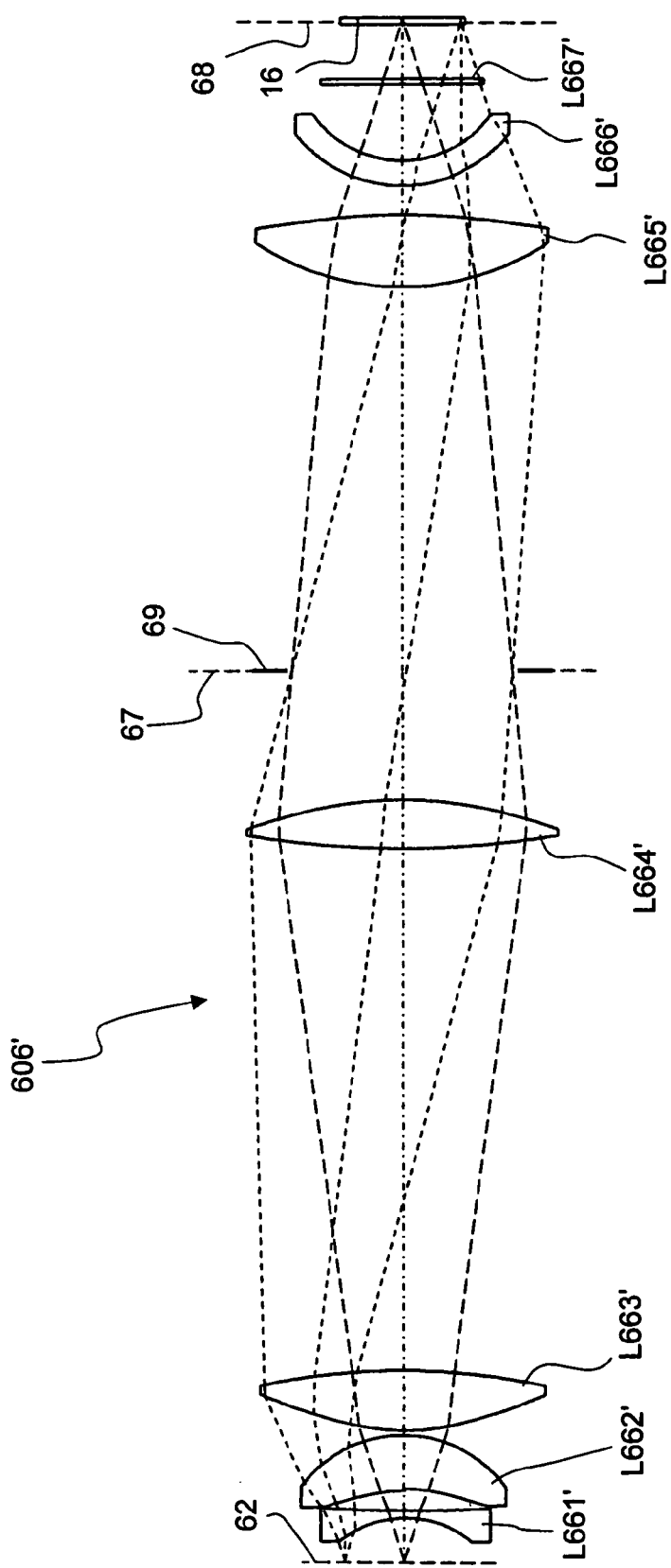
FIG. 9 is a meridional section through an alternative embodiment for the field stop objective shown in FIG. 8.

FIG. 9 shows an alternative design for the field stop objective which is denoted in its entirety by 666'. The lens data and the aspherical constants of the field stop objective 666' are given in tables 14 and 15, respectively. Aspherical surfaces are indicated in column 1 by an asterisk.

The main difference between the field stop objective 606' shown in FIG. 9 and the field stop objective 606 shown in FIG. 8 is that the last three curved lenses L665 to L667 of the field stop objective 666 have been replaced by two lenses L665' and L666'. The lens L665' is a bi-convex lens having an aspherical rear surface. The positive refractive power of the lens L665' approximately equals the combined optical power of the lenses L665 and L666 of the field stop objective 666 shown in FIG. 8. The last curved lens L666' is a negative meniscus lens, similar to the lens L666 of the embodiment shown in FIG. 8.

TABLE 14

Lens data of embodiment #7

| S# | RADIUS | THICKNESS | MATERIAL | ½ Diameter |
|---|---|---|---|---|
| 1 | ∞ | 41.9861 | | 54.50 |
| 2 | −95.03220 | 7.0000 | SIO2HL | 60.79 |
| 3 | 1411.85000 | 18.8033 | | 75.71 |
| 4* | −133.33411 | 50.6593 | SIO2HL | 76.73 |
| 5 | −115.48230 | 4.4140 | | 91.48 |
| 6* | 184.97857 | 56.4211 | SIO2HL | 127.28 |
| 7 | −600.22546 | 495.0160 | | 128.29 |
| 8 | 859.42677 | 46.1039 | CAF2HL | 140.03 |
| 9* | −339.43972 | 121.7656 | | 139.71 |
| 10 | ∞ | 205.9152 | | 102.01 |
| 11 | ∞ | 157.1883 | | 178.83 |
| 12 | 240.56900 | 68.0000 | SIO2HL | 131.65 |
| 13* | −548.09685 | 27.1165 | | 128.62 |
| 14 | 124.10190 | 23.5076 | SIO2HL | 95.66 |
| 15 | 99.29100 | 72.0520 | | 81.95 |
| 16 | ∞ | 5.0000 | SIO2HL | 72.89 |
| 17 | ∞ | 51.4480 | | 71.91 |
| 18 | ∞ | 6.3000 | SIO2HL | 55.73 |
| 19 | ∞ | 0.0000 | | 54.62 |

TABLE 15

Aspherical constants of embodiment #7

| S# | k | A | B | C | D |
|---|---|---|---|---|---|
| 4 | −0.38566E+01 | 0.13610E−06 | −0.20627E−10 | 0.24693E−14 | −0.11456E−18 |
| 6 | −0.75624E+01 | 0.15558E−07 | −0.48560E−12 | 0.86199E−17 | |
| 9 | 0.16726E+01 | 0.15002E−07 | 0.97625E−15 | 0.47824E−17 | |
| 13 | −0.33526E+01 | 0.10256E−07 | −0.45608E−13 | −0.10392E−18 | |

The embodiments shown in FIGS. 8 and 9 generally differ from the embodiments previously described in that the condenser 606 has a larger telecentricity error of up to 1.2 mrad. This value is significantly larger than the telecentricity errors of the condensers of the embodiments shown in FIGS. 3 to 6. This has the advantage that only four or, if a slightly larger spherical aberration is acceptable, even three lenses with curved surfaces are required, whereas the embodiments shown in FIGS. 3 to 5 require five or six curved lenses.

The slightly inferior optical properties of the condenser 606 are, however, fully compensated by the field stop objective 666 or 666'. To be more precise, the entire sub-system consisting of the condenser 606 and the field stop objective 666 or 666' has a telecentricity error of less than 0.3 mrad in the mask plane 68. This is a very low value for an optical sub-system having a geometrical optical flux of 16.4 mm. Thus even very tight specifications for telecentricity errors and also uniformity and ellipticity in the mask planes 68 may be fully met with the design shown in FIGS. 8 and 9.

Therefore it may be advantageous to optimize the design of the condenser and the field stop objective not separately for each component, but for the entire optical sub-system consisting of the condenser and the field stop objective. By suitably adjusting the optical properties of the condenser on the one hand and the field stop objective on the other hand, it is possible to allow deviations from certain optical properties required in the mask plane 68, in particular of the telecentricity error, by a factor that may be as large as two or even four. Similar considerations apply to the spot size in the field stop plane 62 and the mask plane 68. According to this new approach, residual pupil aberrations of the condenser are accepted, but fully corrected by the subsequent field stop objective.

The diaphragm 69 may not only shield double-reflected light, but also (or alternatively) scattering light produced in the preceding optical elements. Scattering light is mainly generated by minute defects in optical materials that scatter the projection light in arbitrary directions. The portion of the scattering light that is absorbed by lens mounts or the housing of the illumination system is usually of little concern. If, however, the scattered light propagates in such a direction that it eventually reaches the mask, it may cause inhomogeneities with respect to the intensity and angular distribution of the projection light impinging on the mask. In order to reduce the intensity of scattering light impinging on the mask, the aperture of the diaphragm 69 may be determined such that a large portion of the scattering light is effectively shielded by the diaphragm 69 and is therefore prevented from impinging on the mask.

If scattering light is shielded by the diaphragm 69 arranged in the field stop objective 666, it may be necessary to readjust the aperture of the diaphragm 69 each time the angular distribution (i.e. the illumination setting) of the projection light is changed.

In order to avoid such readjustments, it may be advantageous to arrange a diaphragm for shielding scattering at a position where it is not affected by changes of the illumination settings. Some of these possible positions are described below with reference to FIG. 10 that shows an illumination system 12' similar to the illumination system 12 shown in FIG. 2. Optical elements succeeding the condenser 60 are not shown, whereas additional components arranged between the light source 30 and the first optical raster element 34 are schematically illustrated.

These additional components may comprise lenses 110, 112, folding mirrors M1 to M4, a beam homogenizing unit 114 and a (de)polarizer unit 116. In the embodiment shown, the (de)polarizer unit 116 is configured such that a polarizer or a depolarizer may be inserted into an exchange holder.

One possible position for a diaphragm used for shielding scattering light is within a portion of the illumination system 12' that comprises the light source 30, the homogenizing unit 114 and all components in between. This portion is sometimes referred to as beam delivery module. In the embodiment shown, a possible position for a diaphragm inside the homogenizing unit 114 is indicated by 69a.

The diaphragm 69a may be adjustable such that the diameter and/or the geometry of its aperture may be varied. Instead of using a separate mechanical element, the diaphragm may generally be formed by a layer that is applied to a suitable surface of an optical element and is made of a material being opaque for the projection light. For changing the diameter and/or the geometry of the diaphragm aperture, an optical element supporting a different layer may be used instead. The preceding remarks apply generally to all diaphragms in the present context and are therefore not restricted to the position within the beam delivery module.

Another possible position for a diaphragm used for shielding scattering light is the (de)polarizer unit 116. Here a diaphragm 69b is represented by a layer applied to the front surface of the (de)polarizer unit 116.

A further possible position for a diaphragm used for shielding scattering light is the first optical raster element 34. Again, the diaphragm 69c is represented by a layer applied to the first optical raster element 34.

Figure 10:
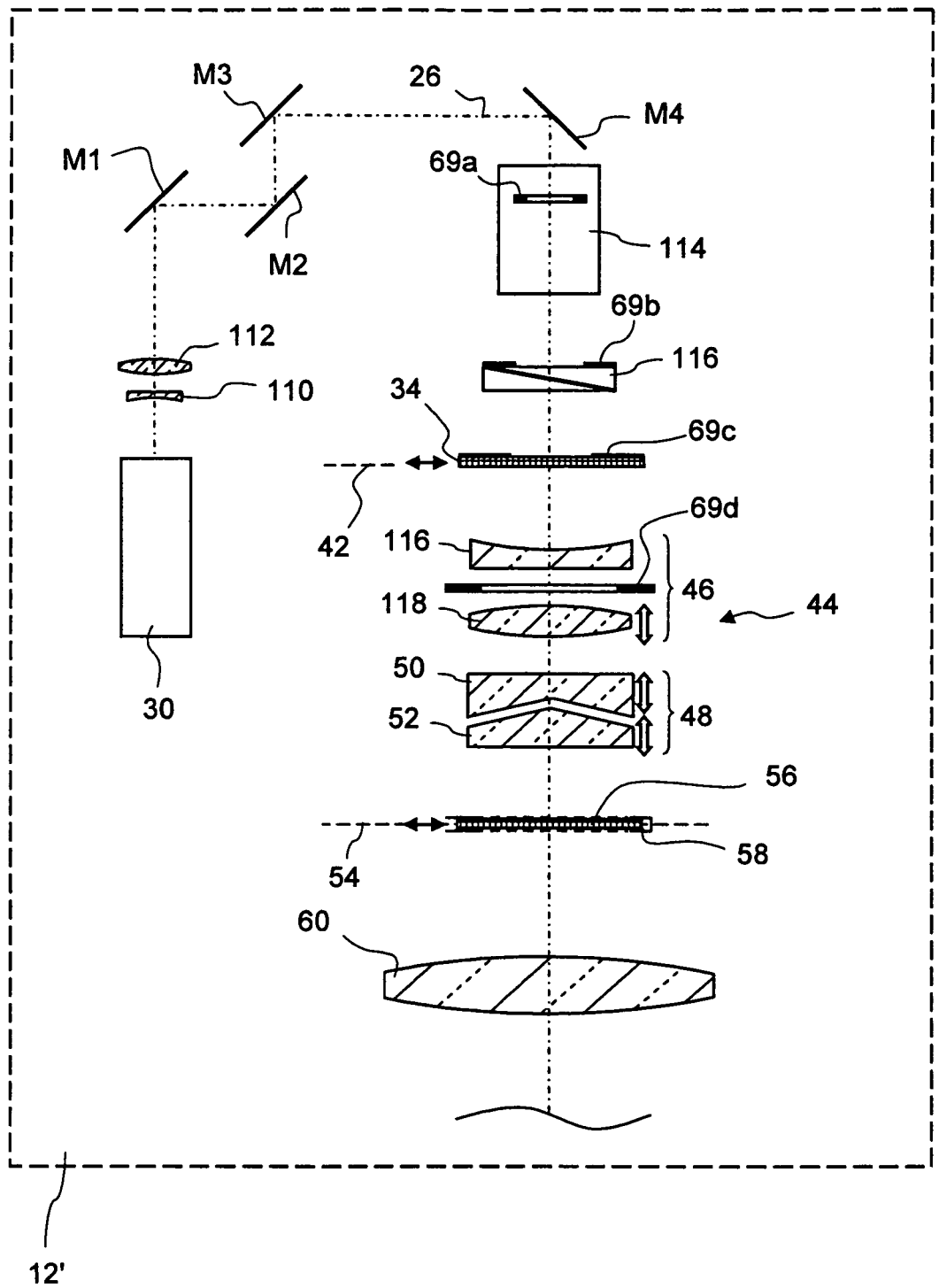
FIG. 10 is a simplified meridional section through another embodiment of the illumination system shown in FIG. 1 comprising a diaphragm positioned at various alternative positions for shielding scattering light.

A still further possible position for a diaphragm used for shielding scattering light is inside the objective 44 at a location preceding the first optical element which can be moved for changing the illumination setting. In FIG. 10 this is illustrated by a diaphragm 69d arranged between a fixed lens 118 and a movable lens 120 of the zoom lens group 44. This position is perhaps the most advantageous one because it does not require adaptations if the illumination setting is changed, but the diaphragm 69d nevertheless shields scattering light produced in a large number of optical elements, namely all optical elements between the light source 30 and the diaphragm 69d.

It is to be understood that more than one diaphragm may be used for shielding scattering light in the illumination system 12'. On the other hand, it is obvious from the foregoing that such a diaphragm may be advantageously used at one or more of the positions discussed above in any other arbitrary illumination systems, i.e. independent from the condenser and field stop objective described further above.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An optical system,
a) a pupil plane,
b) a field plane,
c) a condenser that transforms the pupil plane into the field plane,
d) a field stop objective that images the field plane onto a mask plane, wherein the field stop objective at least partly corrects a residual pupil aberration of the condenser, wherein the optical system is an illumination system of a microlithographic projection exposure apparatus.

2. The optical system of claim 1, wherein
a) the condenser has a maximum telecentricity error angle $\alpha_c$ and
b) the field stop objective has an image side maximum telecentricity error angle $\alpha_o < 0.8 \cdot \alpha_c$.

3. The optical system of claim 2, wherein $\alpha_o < 0.5 \cdot \alpha_c$.

4. The optical system of claim 3, $\alpha_o < 0.3 \cdot \alpha_c$.

5. The optical system of claim 2, wherein $\alpha_o < 0.5$ mrad.

6. The optical system of claim 1, wherein the field stop objective has an image side numerical aperture $NA_i$, and a maximum image height $h_{max}$ with $NA_i \cdot h_{max} > 15$ mm.

7. The optical system of claim 1, wherein the condenser comprises at least four meniscus lenses.

8. The optical system of claim 1, comprising a diaphragm configured to shield double-reflected light and/or scattering light.

9. The optical system of claim 8, wherein the diaphragm is positioned in or in close proximity to a pupil plane of the field stop objective.

10. The optical system of claim 8, wherein the diaphragm is positioned at a position before any optical element that is adjustable to modify the angular distribution of projection light, if seen in a propagation direction along which the projection light propagates.

11. The optical system of claim 10, wherein the adjustable optical element is movable along an optical axis.

12. The optical system of claim 11, wherein the adjustable optical element is a lens of a zoom objective.

13. The optical system of claim 8, comprising an optical raster element which is the first optical element that increases the geometrical optical flux, and wherein the diaphragm is positioned in front of the optical raster element if seen in a propagation direction along which the projection light propagates.

14. The optical system of claim 8, comprising a (de)polarizer to (de)poloarize projection light, and wherein the diaphragm is positioned in front of the (de)polarizer if seen in a propagation direction along which the projection light propagates.

15. The optical system of claim 8, wherein the diaphragm has a variable aperture.

16. The optical system of claim 15, comprising an adjusting mechanism to vary the aperture of the diaphragm.

17. The optical system of claim 8, wherein the diaphragm is formed by a layer that is opaque for projection light and is applied to an optical element through which projection light propagates or is reflected from.

18. The optical system of claim 1, wherein
a) the condenser has a first concave optical surface positioned immediately adjacent the field plane and having a radius of curvature $r_i$ and an axial distance $d_i$ from the field plane with $d_i < r_i < 2.5 \cdot d_i$, and
b) the field stop objective has a second concave optical surface being positioned immediately adjacent the field plane and having a radius of curvature $r_2$ and an axial distance $d_2$ from the field plane with $d_2 < r_2 < 2.5 \cdot d_2$.

19. The optical system of claim 18, wherein the working distance of the field stop objective from the field plane is between 10 mm and 90 mm.

20. The optical system of claim 18, wherein the radius of curvature $r_i$ is greater than 80 mm.

21. The optical system of any of claims 18, wherein the radius of curvature $r_2$ is greater than 80 mm.

22. The optical system of claim 1, wherein
a) the condenser focuses a collimated light bundle entering the pupil plane onto a spot in the field plane having a spot diameter of less than 1.2 mm, and
b) the field stop objective images a point in the field plane on the mask as a spot with a spot diameter of less than 0.4 mm.

23. A microlithographic projection exposure apparatus, comprising the optical system of claim 1.

24. A microlithographic method of fabricating a microstructured device, comprising the following steps:
a) providing a substrate supporting a light sensitive layer;
b) providing a mask containing structures to be imaged onto the light sensitive layer;
c) providing a projection exposure apparatus of claim 23;
d) projecting at least a part of the mask onto the light sensitive layer.

25. An optical system, comprising:
a) a pupil plane,
b) a field plane,
c) a condenser that transforms the pupil plane into the field plane, wherein the condenser focuses a collimated light bundle entering the pupil plane onto a spot in the field plane having a spot diameter of less than 1.2 mm,
d) a field stop objective that images the field plane onto a mask plane, wherein the field stop objective images a point in the field plane on the mask as a spot with a spot diameter of less than 0.4 mm, and wherein the field stop objective has an image side numerical aperture $NA_i$, and a maximum image height $h_{max}$ with $NA_i \cdot h_{max} > 15$ mm,
wherein the optical system is an illumination system of a microlithographic projection exposure apparatus.

* * * * *

UNITED STATES PATENT AND TRADEMARK OFFICE
CERTIFICATE OF CORRECTION

PATENT NO. : 8,873,151 B2
APPLICATION NO. : 11/911904
DATED : October 28, 2014
INVENTOR(S) : Sohmer et al.

It is certified that error appears in the above-identified patent and that said Letters Patent is hereby corrected as shown below:

On the title page item [54], line 2, delete "MICROLITHGRAPHIC" and insert
-- MICROLITHOGRAPHIC --.

In the specification

Col. 1, line 2, delete "MICROLITHGRAPHIC" and insert -- MICROLITHOGRAPHIC --.

Col. 6, line 20, delete "15 of" and insert -- of --.

Col. 6, Table 1, line 66, delete "SI02" and insert -- $SiO_2$ --.

Col. 7, Table 1, line 7 & 9, delete all occurrences of "CAF2" and insert -- $CaF_2$ --.

Col. 7, Table 1, line 11, 13, 14 & 16, delete all occurrences of "SI02" and insert -- $SiO_2$ --.

Col. 10, Table 4, line 16 & 17, delete "CAF2" and insert -- $CaF_2$ --.

Col. 10, Table 4, line 19-29, delete "SI02" and insert -- $SiO_2$ --.

Col. 11, Table 6, line 60 & 62, delete "CAF2" and insert -- $CaF_2$ --.

Col. 11, Table 6, line 63, 65 & 67, delete "SI02" and insert -- $SiO_2$ --.

Col. 12, Table 6, line 7 & 9, delete "SI02" and insert -- $SiO_2$ --.

Col. 12, Table 8, line 51 & 53, delete "CAF2" and insert -- $CaF_2$ --.

Col. 12, Table 8, line 56-63, delete "SIO2" and insert -- $SiO_2$ --.

Col. 13, Table 10, line 33 & 34, delete "CAF2" and insert -- $CaF_2$ --.

Col. 13, Table 10, line 36, 38 & 39, delete "SIO2" and insert -- $SiO_2$ --.

Col. 14, Table 12, line 41, delete "SIO2N2" and insert -- $SiO_2N_2$ --.

Col. 14, Table 12, line 59, delete "CAF2N2" and insert -- $CaF_2N_2$ --.

Col. 14, Table 12, line 61-66, delete all occurrences of "SIO2N2" and insert -- $SiO_2N_2$ --.

Col. 15, Table 12, line 8, 10, 13, 18, 19, 21 & 23, delete "SIO2N2" and insert -- $SiO_2N_2$ --.

Col. 15, Table 12, line 14, delete "CAF2N2" and insert -- $CaF_2N_2$ --.

Col. 17, line 43, delete "preceeding" and insert -- preceding --.

Signed and Sealed this
Twenty-second Day of March, 2016

Michelle K. Lee
*Director of the United States Patent and Trademark Office*

CERTIFICATE OF CORRECTION (continued)
U.S. Pat. No. 8,873,151 B2

Col. 18, Table 14, line 8, 11, 13, 19, 21, 23, 24 & 26, delete "SIO2HL" and insert -- $SiO_2HL$ --.

Col. 18, Table 14, line 14, delete "CAF2HL" and insert -- $CaF_2HL$ --.

In the claims

Col. 21, line 15, Claim 14, delete "poloarize" and insert -- polarize --.

Col. 22, line 3, Claim 21, delete "any of claims 18," and insert -- claim 18, --.